(12) United States Patent
Wang et al.

(10) Patent No.: US 9,380,718 B2
(45) Date of Patent: Jun. 28, 2016

(54) LATCH DEVICE AND SERVER USING THE SAME

(71) Applicants: INVENTEC (PUDONG) TECHNOLOGY CORPORATION, Shanghai (CN); INVENTEC CORPORATION, Taipei (TW)

(72) Inventors: Jia-Bin Wang, Shanghai (CN); Xin-Kai Shi, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 9 days.

(21) Appl. No.: 14/614,428

(22) Filed: Feb. 5, 2015

(65) Prior Publication Data

US 2016/0143165 A1 May 19, 2016

(30) Foreign Application Priority Data

Nov. 13, 2014 (CN) .......................... 2014 1 0640354

(51) Int. Cl.
*H05K 5/00* (2006.01)
*H05K 5/02* (2006.01)
*H05K 7/14* (2006.01)

(52) U.S. Cl.
CPC ............ *H05K 5/0221* (2013.01); *H05K 7/1488* (2013.01)

(58) Field of Classification Search
USPC ............... 361/728–732, 755, 679.01, 679.31, 361/679.45; 439/76.2, 62, 75, 79, 949; 292/110, 113, 336.3; 220/262, 400
See application file for complete search history.

(56) References Cited

U.S. PATENT DOCUMENTS

| 6,174,007 | B1* | 1/2001 | Schlack | .................... E05B 5/00 292/336.3 |
| 6,824,174 | B2* | 11/2004 | Lin | ........................ E05B 63/248 16/110.1 |
| 7,325,846 | B2* | 2/2008 | Smith | .................... E05C 19/006 292/137 |
| 7,843,698 | B2* | 11/2010 | Takizawa | ................ G06F 1/181 361/732 |
| 8,270,173 | B2* | 9/2012 | Chang | .................. H05K 5/0221 361/679.01 |
| 9,207,721 | B2* | 12/2015 | Conn | ....................... G06F 1/181 |
| 2004/0021325 | A1* | 2/2004 | Schlack | .................. E05C 1/065 292/110 |
| 2006/0214431 | A1* | 9/2006 | Helsley | .................. B64D 29/06 292/113 |
| 2013/0146596 | A1* | 6/2013 | Chen | ....................... G06F 1/181 220/262 |

FOREIGN PATENT DOCUMENTS

| TW | 201009824 A | 3/2010 |
| TW | 455325 U | 6/2013 |
| TW | 478984 U | 5/2014 |

* cited by examiner

*Primary Examiner* — Hung S Bui
(74) *Attorney, Agent, or Firm* — Mark M. Friedman

(57) ABSTRACT

A latch device is provided, which is used for a server. The latch device comprises: a positioning post fixed on a case of the server; a containing shelf fixed on a top cover of the server; a shifting plate fixed in the containing shelf through at least one fixing parts, wherein the fixing part permits the shifting plate moved along an opening thereof; and a rotating handle jointed with the shifting plate through two rotating axles and able to be moved between a first rotating position and a second rotating position. When the positioning post is inserted into an insertion hole of the shifting plate inside the containing shelf, the rotating handle can drive the containing shelf to be moved backward and forward, so that the top cover is driven to be moved backward and forward with the containing shelf, and the shifting plate is moved therewith.

10 Claims, 12 Drawing Sheets

LATCH DEVICE AND SERVER USING THE SAME

TECHNICAL FIELD

The disclosure relates to a technological field of mechanical structures, and more particularly to a latch device and a server.

BACKGROUND

Recently, with progression of the science technology, electric kinds of products and their accessories are applied popularly more and more, and improved towards a design direction with a lightweight and compact size, so as to increase the convenience. Due to the minimizations of the electric kinds of products and their accessories, the assembly of the electric products and accessories is becoming more difficult. For conveniently assembling an electric kind of product and its accessories, generally all parts of the electric kind of product and its accessories are installed inside a case of the electric kind of product and its accessories, and then a top cover is used to close the case after the installation.

Referring to FIGS. 1A and 1B which are structural schematic views of an electric kind of product and its accessories, a top cover 10 is disposed on a case 11, used for closing the case 11. A button 12 is disposed on the top cover 10 and is connected with a lock latch 13 which is disposed inside the top cover 10 and located under the button 12. An engaging portion 14 corresponding to the lock latch 13 is disposed on the case 11. The lock latch 13 can tightly lock the engaging portion 14, so as to fix the top cover 10 on the case 11. When it is necessary to move the top cover 10 out from the case 11, the button 12 is pushed to drive the lock latch 13 being disengaged from the engaging portion 14, so that the top cover 10 is released from the case 11, and the top cover 10 can be moved out from the case 11 to accomplish a disassembly of the top cover 10.

However, when pushing the button 12, the lock latch 13 is frequently stuck, and cannot be disengaged from the engaging portion 14. It causes difficulty of dissembling the top cover 10.

SUMMARY

To resolve the aforementioned drawback, an objective of the disclosure is to provide a latch and a server using the same which is capable of accomplishing a smooth assemble and disassemble of a top cover with regard to a case.

For solving the above-mentioned technical problems, the disclosure provides a latch device used for a server, which comprises:

a positioning post fixed on a case of the server;
a containing shelf fixed on a top cover of the server;
a shifting plate fixed in the containing shelf by at least one fixing part, wherein the fixing part permits the shifting plate moving along an opening of the shifting plate, between a first positing and a second position, corresponding to the containing shelf; and
a rotating handle jointed with the shifting plate by two rotating axles, wherein the rotating handle is able to be moved between a first rotating position and a second rotating position;
wherein when the positioning post is inserted into an insertion hole of the shifting plate inside the containing shelf, the rotating handle is rotated between a first rotating position and a second rotating position to drive backward and forward movements of the containing shelf so that the top cover is driven to be moved backward and forward with the containing shelf, and the shifting plate is moved therewith, between the first rotating position and the second rotating position, corresponding to the containing shelf.

The disclosure further provides a server with a latch device, which comprises:

a case, a top cover assembled with the case, and a latch device fixed on the top cover;
wherein the latch device comprises:
a positioning post fixed on the case of the server;
a containing shelf fixed on the top cover of the server;
a shifting plate fixed in the containing shelf by at least one fixing part, wherein the fixing part permits the shifting plate moving along an opening of the shifting plate, between a first positing and a second position, corresponding to the containing shelf; and
a rotating handle jointed with the shifting plate by two rotating axles, wherein the rotating handle is able to be moved between a first rotating position and a second rotating position;
wherein when the positioning post is inserted into an insertion hole of the shifting plate inside the containing shelf, the rotating handle is rotated between a first rotating position and a second rotating position to drive backward and forward movements of the containing shelf so that the top cover is driven to be moved backward and forward with the containing shelf while the top cover covers or is released from the case, and the shifting plate is moved therewith, between the first rotating position and the second rotating position, corresponding to the containing shelf

DETAILED DESCRIPTION

Figure 1A:
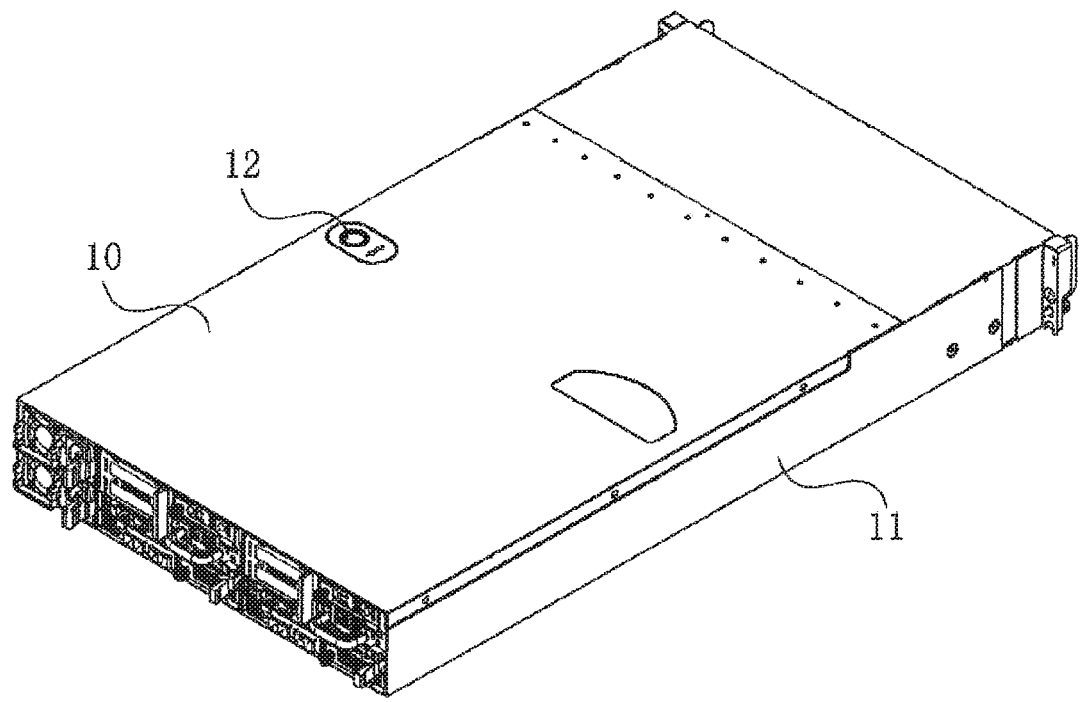
FIGS. 1A and 1B are structural schematic views of an electric kind of product and its accessories according to a conventional technology.
Figure 1B:
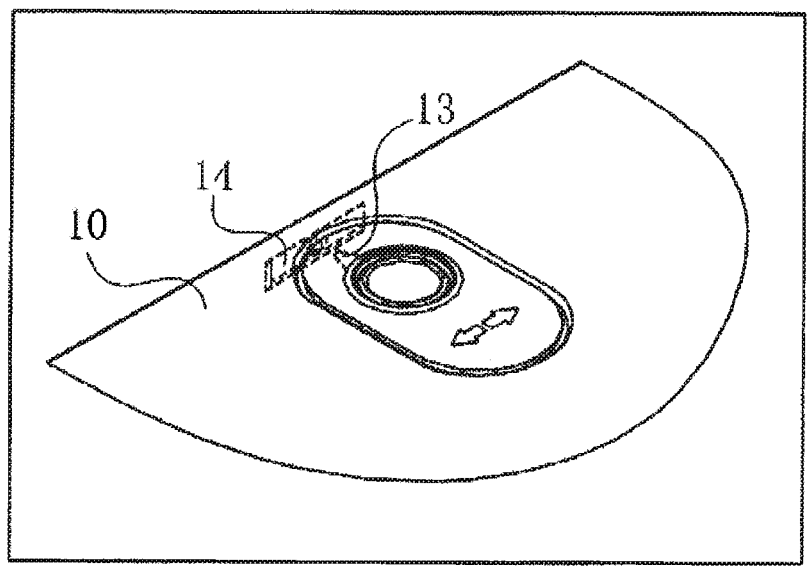
Figure 2:
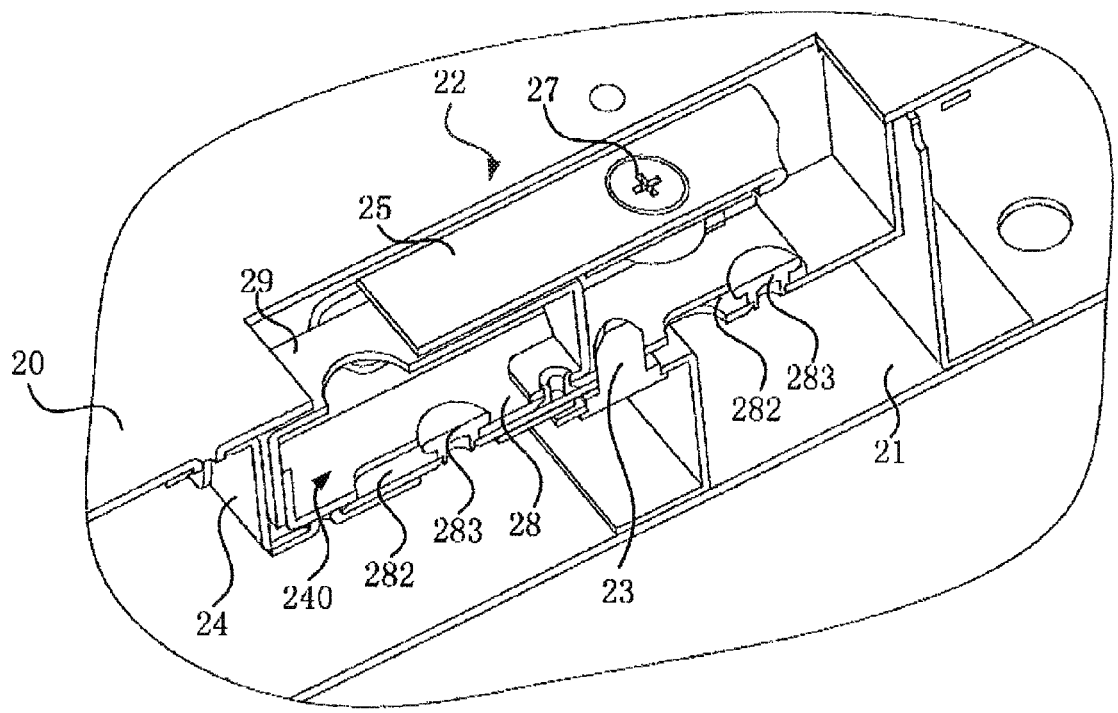
FIG. 2 is a cross-sectional schematic view of a latch device of the embodiment.

The accompanying drawings and the following embodiment of a latch device and a server using the same according to the embodiment is described in further detail below.

Now referring to FIGS. 2 to 5B, a latch device 22 according to the embodiment is suitable for a server (not shown in the figure). The latch device 22 comprises a positioning post 23, a containing shelf 24, a shifting plate 28 and a rotating handle 25. The server comprises a top cover 20 and a case 21. The latch device 22 is used to permit the top cover 20 of the server moving corresponding to the case 21.

The positioning post 23 is fixed on the case 21 of the server. The containing shelf 24 is fixed on the top cover 20 of the server. Furthermore, the containing shelf 24 is fixed on the top cover 20 to form a containing chamber 240.

The shifting plate 28 is fixed within the containing shelf 24 by at least one fixing part 283, and is further disposed in the bottom of the containing chamber 240. The fixing part 283 permits the shifting plate 28 moving along a first long opening 282 of the shifting plate 28, between a first position and a second position, corresponding to the containing shelf 24. That is, along an axial direction of the containing shelf 24, the shifting plate 28 is moved along the first long opening 282 corresponding to the containing shelf 24.

The first long opening 282 is extended along the axial direction of the containing shelf 24. The fixing part 283 can be a shoulder bolt, and a hat structure thereof can prevent the shifting plate 28 from being raised from the containing shelf 24, and permit the shifting plate 28 moved. In the specific embodiment, the shifting plate 28 is provided with two of the first long openings 282 extended along an axial direction of the containing chamber 240, and the two fixing parts 283 permit the shifting plate 28 moving along the two first long openings 282, between the first position and the second position, corresponding to the containing shelf 24.

In the specific embodiment, a second long openings 241 is disposed in the bottom of the containing chamber 240, and is extended along the axial direction of the containing chamber 240. The second long openings 241 permits the positioning post 23 to be inserted therein and moved therealong. The shifting plate 28 is provided with an inserting hole 281, which permits the positioning post 23 to pass the second long openings 241 and insert therein, so as to fix the shifting plate 28 with regard to the case 21.

Figure 4A:
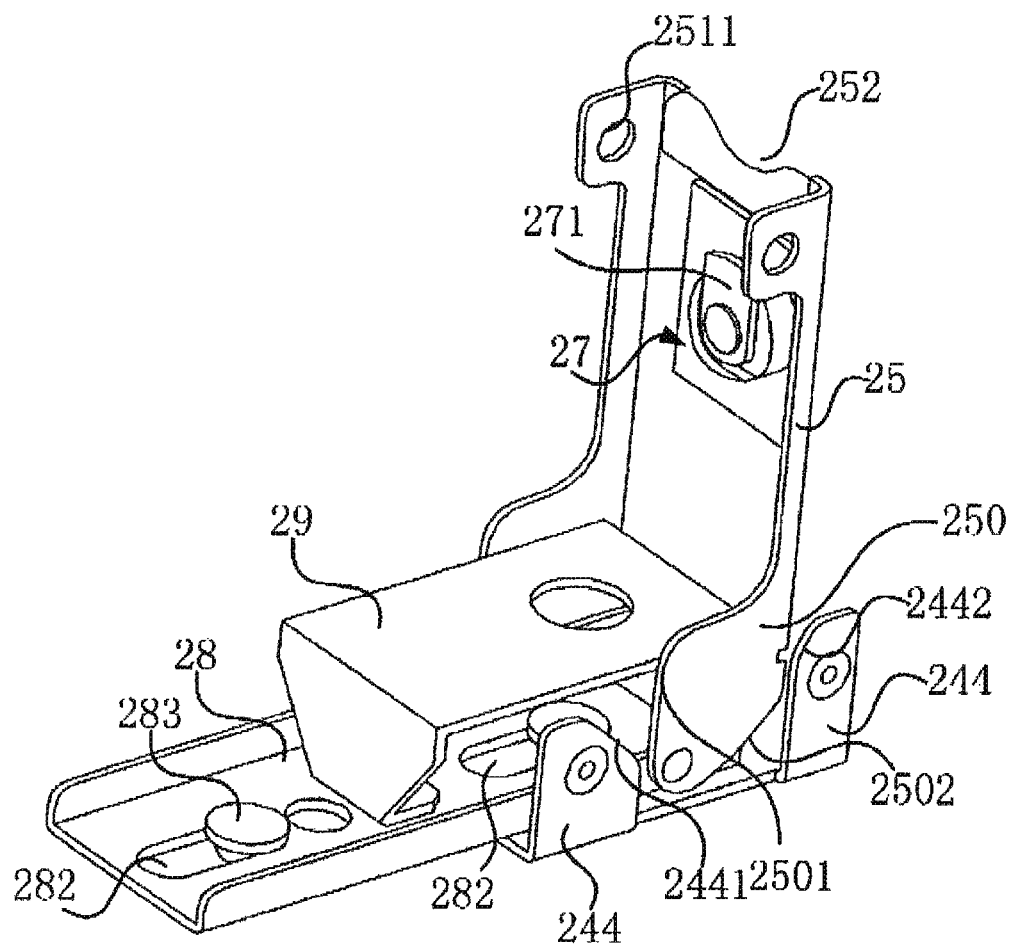
FIG. 4A is a structural schematic view of the latch device according to the embodiment, showing that a rotating handle is being located in a first rotating position.
Figure 4B:
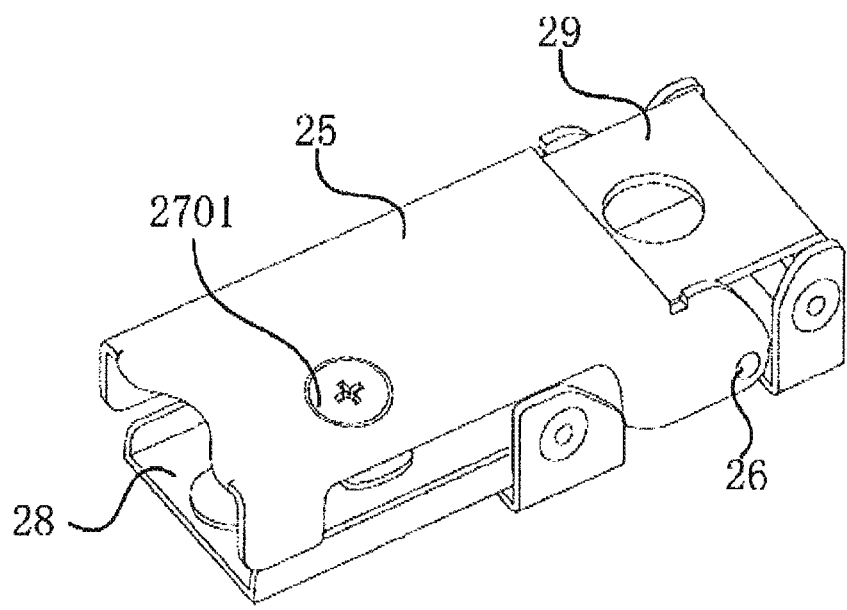
FIG. 4B is a structural schematic view of the latch device according to the embodiment, showing that the rotating handle is being located in a second rotating position.
Figure 5A:
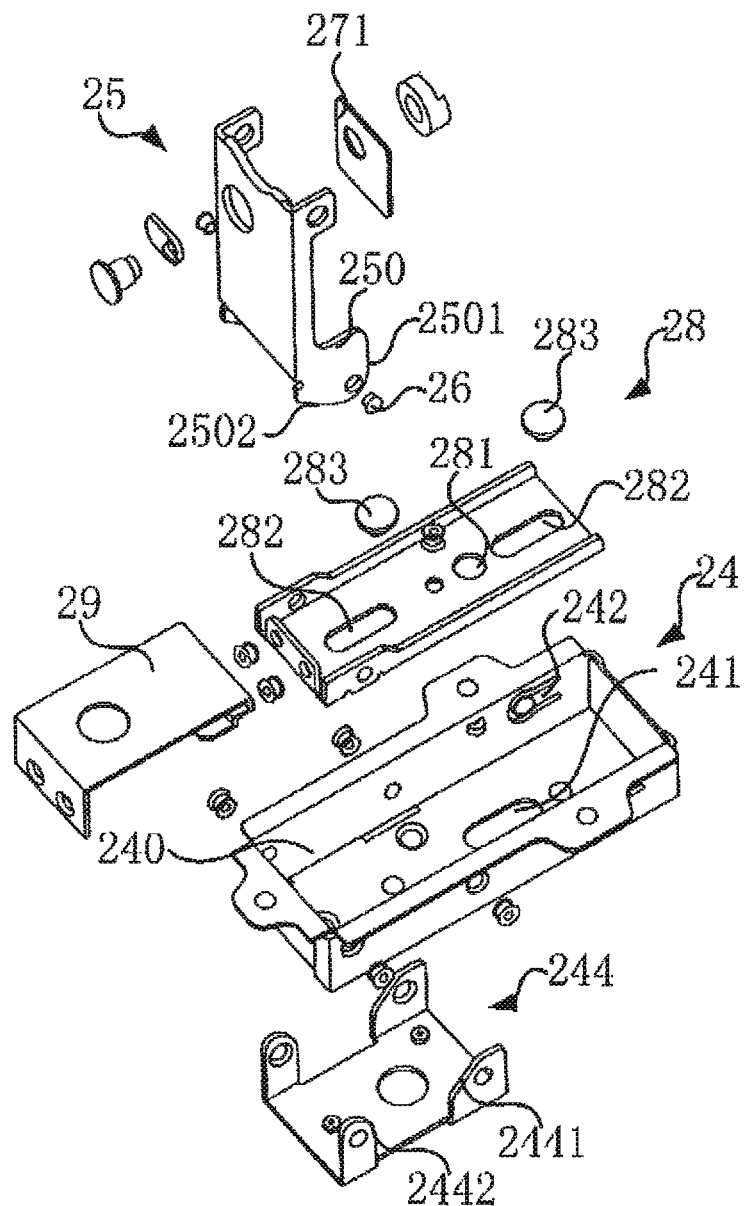
FIG. 5A is an exploded structural schematic view of the latch device according to the embodiment, showing that the rotating handle is being located in the first rotating position.
Figure 5B:
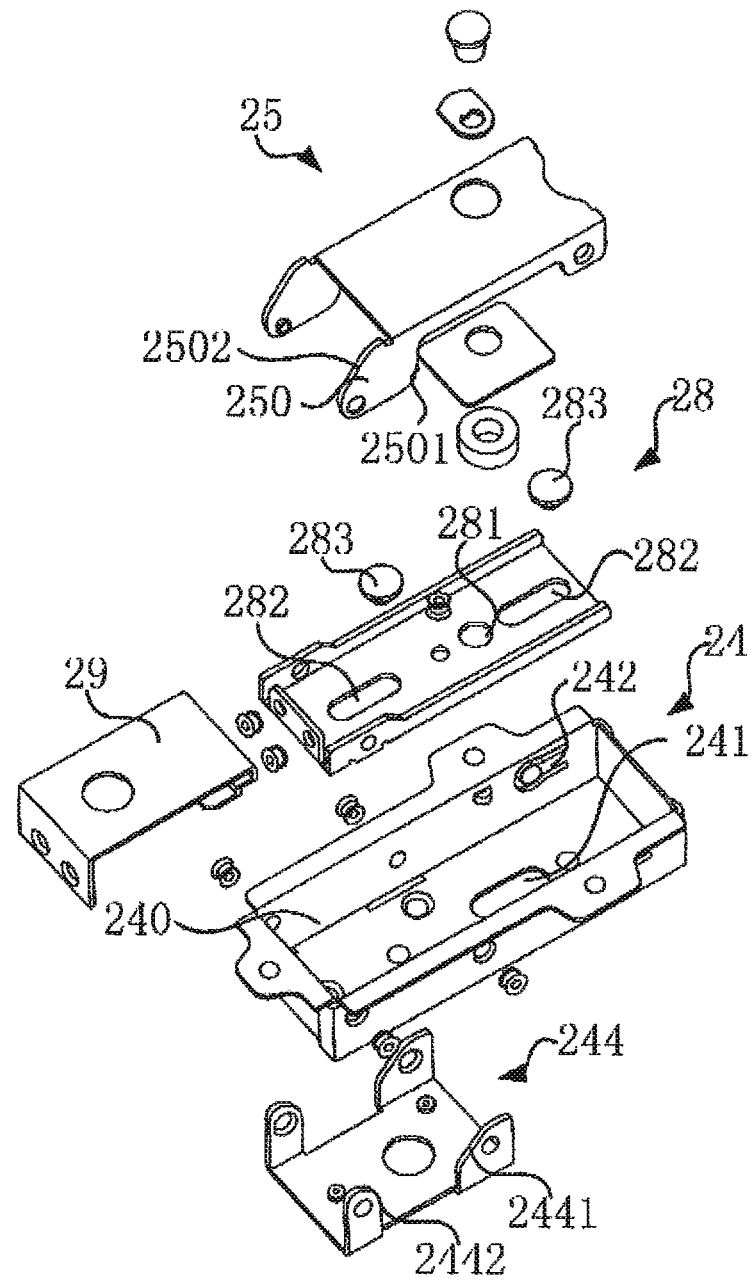
FIG. 5B is an exploded structural schematic view of the latch device according to the embodiment, showing that the rotating handle is located in the second rotating position.

The rotating handle 25 is jointed with the shifting plate 28 by two rotating axles 26, and the rotating handle 25 can be rotated between a first rotating position and a second rotating position. In the specific embodiment, the first rotating position is a position where the rotating handle 25 is perpendicular to the containing shelf 24, as shown in FIG. 4A; and the second rotating position is a position where the rotating handle 25 is horizontal to the containing shelf 24, as shown in FIG. 4B. The rotating handle 25 is jointed with the shifting plate 28 by the two rotating axles 26, namely the rotating handle 25 is rotatably connected with the shifting plate 28, and can be rotated between the first rotating position and the second rotating position.

When the positioning post 23 is inserted into the inserting hole 281 of the shifting plate 28 inside the containing shelf 24, the rotating handle 25 rotatable between the first rotating position and the second rotating position can drive the containing shelf 24 to be moved backward and forward, so that the top cover 20 is driven to be moved backward and forward with the containing shelf 24, and the shifting plate 28 is moved therewith, between the first position and the second position, corresponding to the containing shelf 24.

Furthermore, two corresponding front-rear limiting portions 244 are disposed at two sides of the containing shelf 24, and two corresponding rotating match portions 250 are disposed at a rotating axle end of the rotating handle 25, wherein the rotating axle end is the end of the rotating handle 25 which is close to the rotating axles 26. The rotating match portions 250 are limited by the front-rear limiting portions 244, and can drive the containing shelf 24 to be moved backward and forward when the rotating handle 25 is rotated between the first rotating position and the second rotating position.

In the specific embodiment, each of the front-rear limiting portions 244 has two corresponding active surfaces 2441, 2442, and the rotating match portions 250 has two corresponding pushing surfaces 2501, 2502 corresponding to the active surfaces 2441, 2442 of the front-rear limiting portions 244. When the rotating handle 25 is rotated between the first rotating position and the second rotating position, the pushing surfaces 2501, 2502 can push the active surfaces 2441, 2442 of the front-rear limiting portions 244, so as to drive the cover 20 to be moved backward and forward with the containing shelf 24, and the shifting plate 28 is moved therewith between the first position and the second position corresponding to the containing shelf 24.

When the positioning post 23 is inserted into the second long openings 241 and the inserting hole 281 in order, due to the limit of the inserting hole 281, the shifting plate 28 is fixed corresponding to the case 21, namely the shifting plate 28 cannot be moved corresponding to the case 21. However, since the second long openings 241 is extended along the axial direction of the containing chamber 240, the second long openings 241 provides a moving space for the positioning post 23, namely the positioning post 23 is permitted to be moved in the second long openings 241. The fixing part 283 is fixed in the containing shelf 24, and permits the shifting plate 28 to be moved along the first long opening 282 between the first position and the second position corresponding to the containing shelf 24, so that the fixing part 283 can prevent the shifting plate 28 from being raised from the containing chamber 240, and does not block the movement of the containing shelf 24.

When the rotating handle 25 is pushed from the first rotating position to the second rotating position, the pushing surface 2501 pushes the active surface 2441. Since the front-rear limiting portions 244 are fixed on the containing shelf 24, the containing shelf 24 is pushed toward the moving direction of the rotating handle 25, and the second long openings 241 on the bottom of the containing chamber 240 is moved therewith. Since the positioning post 23 is fixed and the positioning post 23 can be moved in the second long openings 241, the positioning post 23 is moved corresponding to the second long openings 241. Since the shifting plate 28 is fixed corresponding to the case 21 by the positioning post 23 inserting into the inserting hole 281, the shifting plate 28 is fixed corresponding to the case 21, and the fixing parts 283 fixed in the containing shelf 24 permit the shifting plate 28 moved along the axial direction of the containing shelf 24 from the first position to the second position corresponding to the containing shelf 24. Therefore, the latch device 22 drives the top cover 20 to be moved with the movement of the containing shelf 24, and the top cover 20 is horizontally moved corresponding to the case 21.

When the rotating handle 25 is pushed from the second rotating position to the first rotating position, the pushing surface 2502 pushes the active surface 2442. Since the front-rear limiting portions 244 are fixed on the containing shelf 24, the containing shelf 24 is pushed toward the moving direction of the rotating handle 25, and the second long openings 241 on the bottom of the containing chamber 240 is moved therewith. Since the positioning post 23 is fixed and the positioning post 23 can be moved in the second long openings 241, the positioning post 23 is moved corresponding to the second long openings 241. Since the shifting plate 28 is fixed corresponding to the case 21 by the positioning post 23 inserting into the inserting hole 281, the shifting plate 28 is fixed corresponding to the case 21, and the fixing parts 283 fixed in the containing shelf 24 permit the shifting plate 28 to be moved along the axial direction of the containing shelf 24 from the second position to the first position corresponding to the containing shelf 24. Therefore, the latch device 22 drives the top cover 20 to be moved with the movement of the containing shelf 24, and the top cover 20 is horizontally moved corresponding to the case 21.

Two fixing openings 2511 are disposed on a far end of the rotating handle 25, wherein the far end is the end of the rotating handle 25 which is far away from the rotating axles 26. The two sides of the containing shelf 24 are provided with an elastic protrusion 242, respectively. When the rotating handle 25 is in the second rotating position, the elastic protrusions 242 are engaged into the fixing openings 2511.

When the rotating handle 25 is rotated from the first rotating position to the second rotating position, the far end of the rotating handle 25 is contacted with the elastic protrusions 242. Since the far end of the rotating handle 25 has an out push force to the elastic protrusions 242, the elastic protrusions 242 are deformed toward a direction away from the containing chamber 240. When the far end of the rotating handle 25 is moved to the second rotating position, where the fixing openings 2511 correspond to the elastic protrusions 242, the elastic protrusions 242 are engaged into the fixing openings 2511, so as to fix the rotating handle 25 on the containing shelf 24, and prevent the rotating handle 25 from rotating.

When the rotating handle 25 fixed in the containing shelf 24 is forced to rotate from the second rotating position to the first rotating position, the elastic protrusions 242 depart from the fixing openings 2511. Since the far end of the rotating handle 25 has an out push force to the elastic protrusions 242, the elastic protrusions 242 are deformed toward a direction away from the containing chamber 240. When the far end of the rotating handle 25 is moved to the first rotating position, the far end of the rotating handle 25 departs from the elastic protrusions 242, namely the elastic protrusions 242 are recovered, and the rotating handle 25 is released from the elastic protrusions 242.

Furthermore, the far end of the rotating handle 25 is provided with a recess 252 along an axial direction of the rotating handle 25. A gap is formed between the recess 252 and the end portion of the containing shelf 24, so that the rotating handle 25 is easy to be pulled out from the containing shelf 24. When the rotating handle 25 is fixed in the containing shelf 24, if it is necessary to pull the rotating handle 25 up, the recess 252 can be as a start point to pull the rotating handle 25.

Furthermore, the far end of the rotating handle 25 has a lock latch structure 27, and the containing shelf 24 has a lock latch portion 243. When the rotating handle 25 is in the second rotating position, rotating the lock latch structure 27 can switch the open or close condition of the lock latch structure 27 to the lock latch portion 243.

Figure 6:
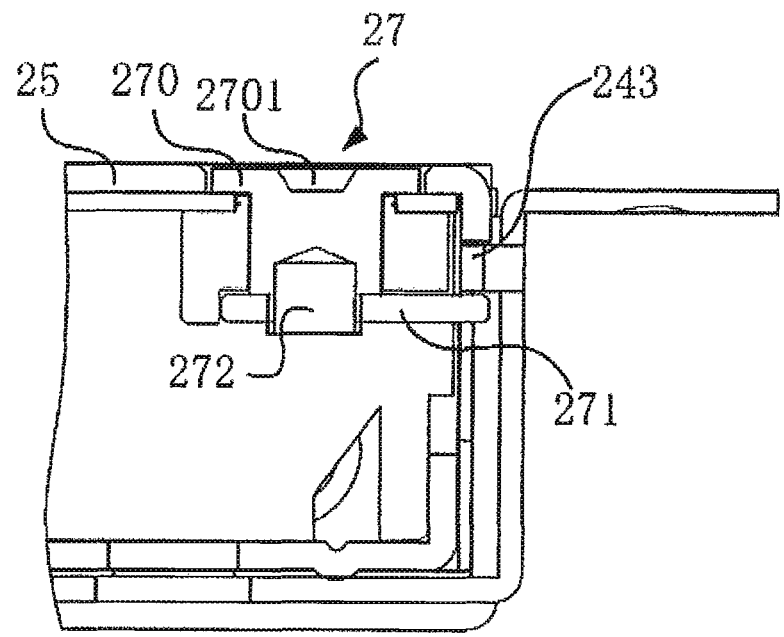
FIG. 6 is a structural schematic view of a lock latch structure.

FIG. 6 is a structural schematic view of the lock latch structure 27. The lock latch structure 27 comprises a rotating portion 270 embedded on the rotating handle 25 and a ratchet sheet 271 disposed inside the rotating handle 25. The rotating handle 25 has a screw head 2701 which is exposed on the surface of the rotating handle 25, and a user can easily control the rotation of the rotating portion 270 by the screw head 2701. The screw head 2701 is marked with lock and unlock marks for convenience of the user. The rotating portion 270 is connected with the screw head 2701. Furthermore, the rotating portion 270 is connected with the screw head 2701 by a bolt 272. When the rotating portion 270 is rotated, the screw head 2701 is rotated therewith. In the specific embodiment, the ratchet sheet 271 can be rotated 90 degrees by the rotating portion 270. The lock latch portion 243 is correspondingly disposed on the inside wall of the containing shelf 24, and the ratchet sheet 271 can be rotated under the lock latch portion 243. The lock latch portion 243 can limit the ratchet sheet 271 from up-down action, so as to prevent the rotating handle 25 from rotation corresponding to the containing chamber 240.

When the screw head 2701 is directed to a lock position, the ratchet sheet 271 is under the lock latch portion 243, and the lock latch portion 243 can limit the ratchet sheet 271 from up-down action, so as to prevent the rotating handle 25 from rotation corresponding to the containing chamber 240. When the user rotates the screw head 2701 from the lock position to a unlock position, the screw head 2701 drives the ratchet sheet 271 rotated, and the ratchet sheet 271 departs from the lock latch portion 243, so that the rotating handle 25 can be rotated corresponding to the containing chamber 240.

Furthermore, a shell cover 29 is disposed on the shifting plate 28 close to the rotating axles 26, and is fixed with the shifting plate 28. When the rotating handle 25 is closed, the shell cover 29 is used to cover part of the shifting plate 28 to avoid the shifting plate 28 from being exposed too much, and avoid extra objects from dropping into the containing chamber 240.

Figure 3:
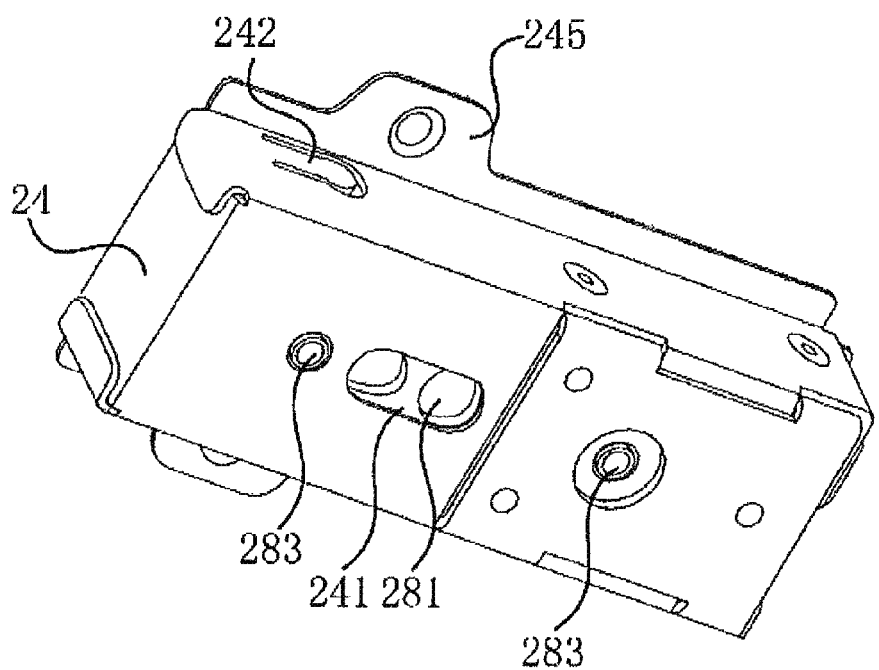
FIG. 3 is a schematic view of the latch device according to the embodiment in another view angle.

Furthermore referring to FIG. 3, at least one fixing portion 245 is disposed on the edge of the containing shelf 24, and the fixing portion 245 is toward the top cover 20. The latch device 22 is fixed on the top cover 20 by the fixing portion 245. The fixing portion 245 can be fixed on the top cover 20 by screw or other mechanical fasteners. The number of the fixing portion 245 is not limited. In the specific embodiment, there are three of the fixing portions 245, wherein two are disposed at the side wall of the containing chamber 240, and one is disposed at the end of the containing chamber 240, so that the latch device 22 is stably fixed on the top cover 20.

Figure 7A:
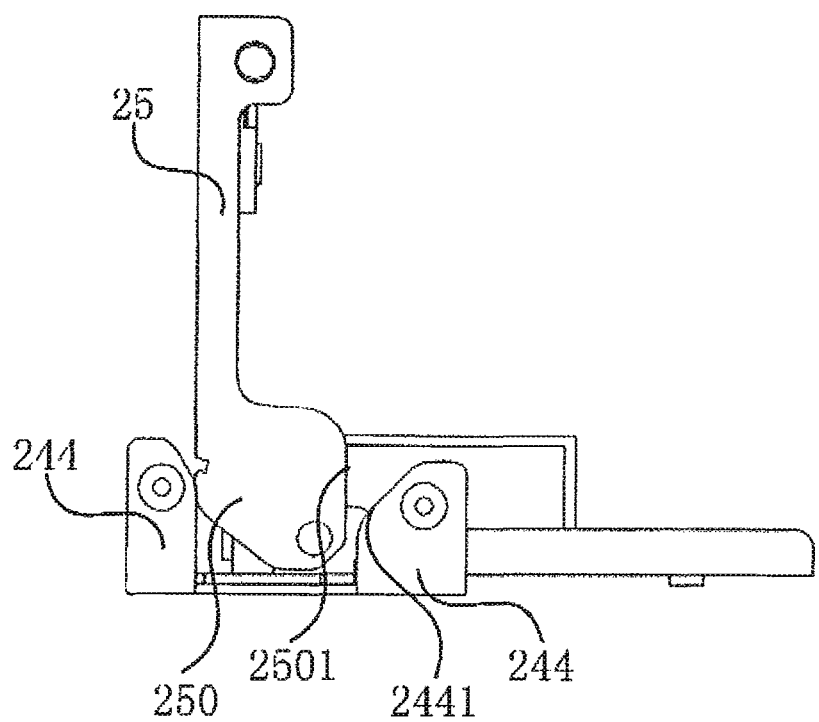
FIGS. 7A-7C are operationally schematic views showing that the latch device of the embodiment is moved from the first rotating position to the second rotating position.
Figure 7B:
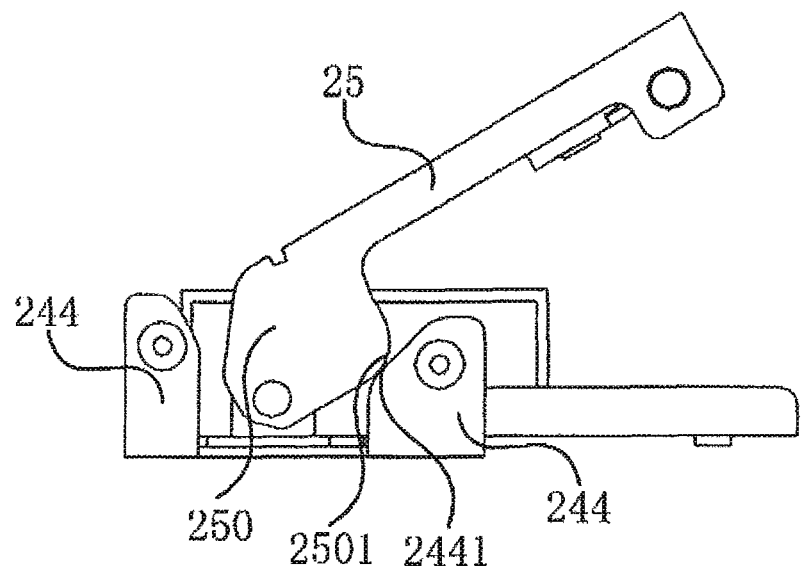
Figure 7C:
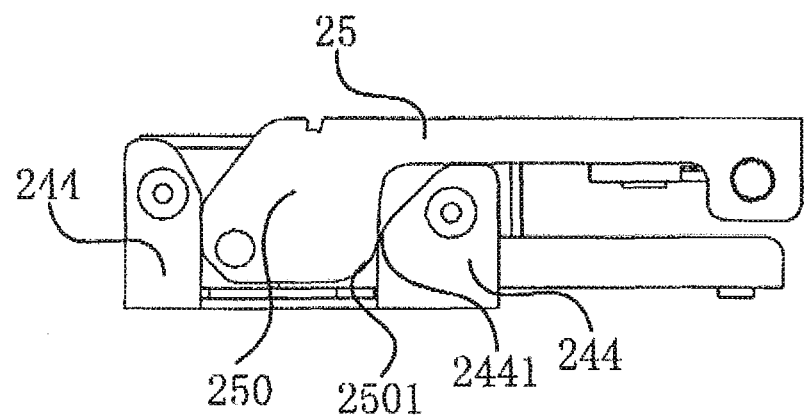

FIGS. 7A-7C show a close operation of the latch device of the embodiment, wherein the containing chamber 240 is not shown for more clearly viewing the action of the latch device.

Referring to FIG. 7A, the rotating handle 25 in the first rotating position is in an initial condition. The dashed line in the figure purposes to schematically show an initial position of an end portion of the front-rear limiting portions 244.

Referring to FIG. 7B, the rotating handle 25 is pushed from the first rotating position to the second rotating position, the pushing surface 2501 pushes the active surface 2441. Since the front-rear limiting portions 244 are fixed on the containing shelf 24, the containing shelf 24 is pushed toward the moving direction of the rotating handle 25, and the second long openings 241 on the bottom of the containing chamber 240 is moved therewith. Since the positioning post 23 is fixed and the positioning post 23 can be moved in the second long openings 241, the positioning post 23 is moved corresponding to the second long openings 241. Since the shifting plate 28 is fixed corresponding to the case 21 by the positioning post 23 inserting into the inserting hole 281, the shifting plate 28 is fixed corresponding to the case 21, and the fixing parts 283 fixed in the containing shelf 24 permit the shifting plate 28 to be moved along the axial direction of the containing shelf 24 from the first position to the second position corresponding to the containing shelf 24. Therefore, the latch device 22 drives the top cover 20 to be moved forward with the movement of the containing shelf 24, and the top cover 20 is horizontally moved corresponding to the case 21.

Referring to FIG. 7C, the rotating handle 25 is continually pushed and rotated. When the rotating handle 25 is pushed/rotated into the containing shelf 24, the pushing surface 2501 stops working on the active surface 2441 so that the latch device 22 is stopped acting with regard to the case 21. Furthermore, the elastic protrusions 242 are engaged into the fixing openings 2511, so as to fix the rotating handle 25 on the containing chamber 240, and prevent the rotating handle 25 from rotation corresponding to the containing chamber 240. Furthermore, by rotating the screw head 2701 of the lock latch structure 27, the rotation of the rotating portion 270 is controlled, and drive the ratchet sheet 271 is rotated under the lock latch portion 243, so as to prevent the rotating handle 25 from rotating corresponding to the containing chamber 240. The dashed line in the figure purposes to schematically show the initial position of the end portion of the front-rear limiting portions 244. Now, the latch device 22 drives the top cover 20 assembled on the case 21.

Figure 8A:
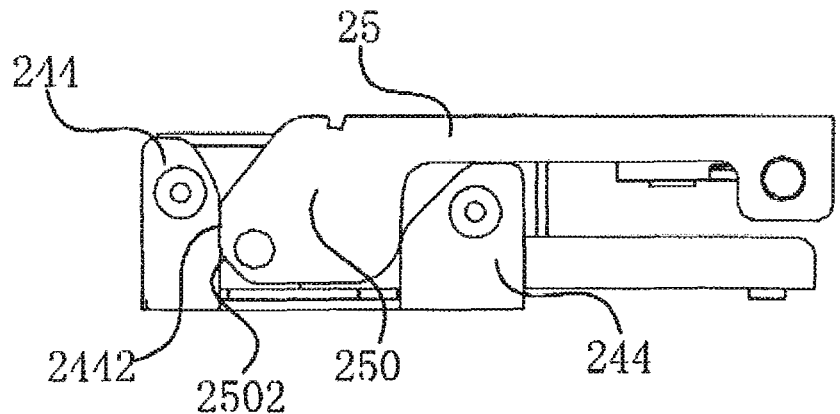
FIGS. 8A-8D are operationally schematic views showing that the latch device of the embodiment is moved from the second rotating position to the first rotating position.

FIGS. 8A-8D show an open operation of the latch device of the embodiment,

Referring to FIG. 8A, the rotating handle 25 in the second rotating position is in an initial condition. The dashed line in the figure purposes to schematically show an initial position of an end portion of the front-rear limiting portions 244.

Figure 8B:
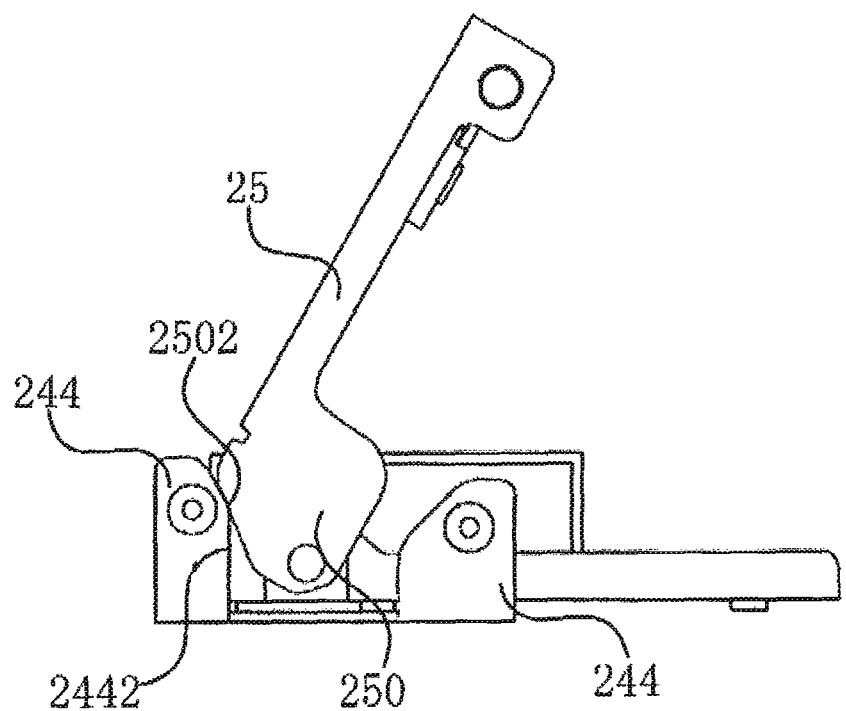
Figure 8C:
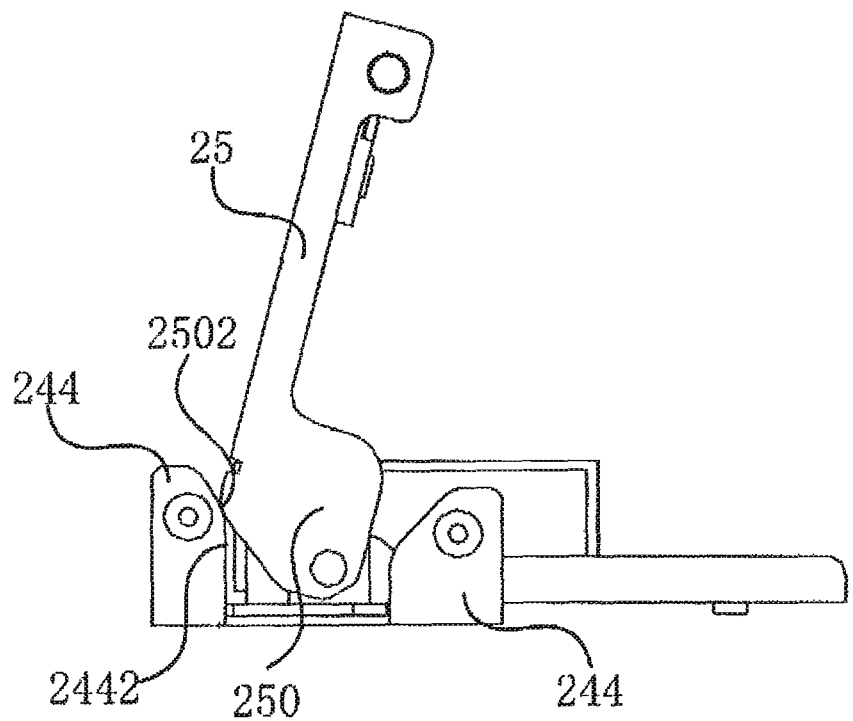

Referring to FIGS. 8B and 8C, the rotating handle 25 is pushed from the second rotating position to the first rotating position so that the pushing surface 2502 pushes the active surface 2442. Since the front-rear limiting portions 244 are fixed on the containing shelf 24, the containing shelf 24 is pushed toward the moving direction of the rotating handle 25, and the second long openings 241 on the bottom of the containing chamber 240 is moved therewith. Since the positioning post 23 is fixed and the positioning post 23 can be moved in the second long openings 241, the positioning post 23 is moved corresponding to the second long openings 241. Since the shifting plate 28 is fixed corresponding to the case 21 by the positioning post 23 inserting into the inserting hole 281, the shifting plate 28 is fixed corresponding to the case 21, and the fixing parts 283 fixed in the containing shelf 24 permit the shifting plate 28 to be moved along the axial direction of the containing shelf 24 from the second position to the first position corresponding to the containing shelf 24.

Furthermore, the elastic protrusions 242 are departed from the fixing openings 2511. Since the far end of the rotating handle 25 has an out push force to the elastic protrusions 242, the elastic protrusions 242 are deformed toward a direction away from the containing chamber 240. When the far end of the rotating handle 25 is moved to the first rotating position, the far end of the rotating handle 25 departs from the elastic protrusions 242, namely the elastic protrusions 242 are recovered, and the rotating handle 25 is released from the elastic protrusions 242.

Therefore, the latch device 22 drives the top cover 20 to be moved backward with the movement of the containing shelf 24, and the top cover 20 is horizontally moved corresponding to the case 21. The dashed line in the figure purposes to schematically show the initial position of the end portion of the front-rear limiting portions 244.

Figure 8D:
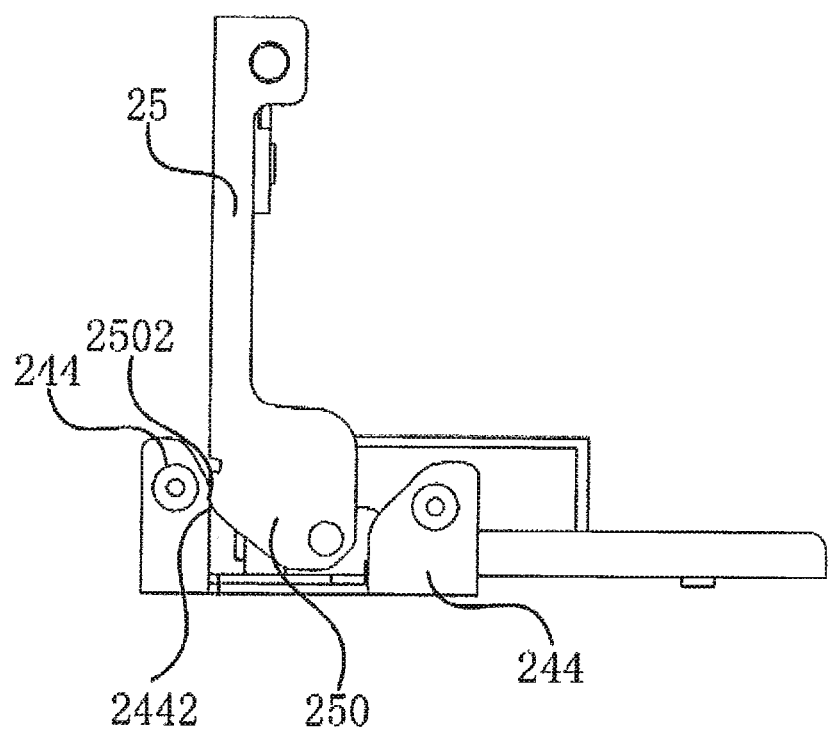

Please refer to FIG. 8D, which continually pulls and rotates the rotating handle 25. When the rotating handle 25 is pulled/rotated to the first rotating position, the pushing surface 2502 stops working on the active surface 2442 so that the latch device 22 is stopped acting with regard to the case 21. Now, the latch device 22 drives the top cover 20 disassembled from the case 21.

Figure 9:
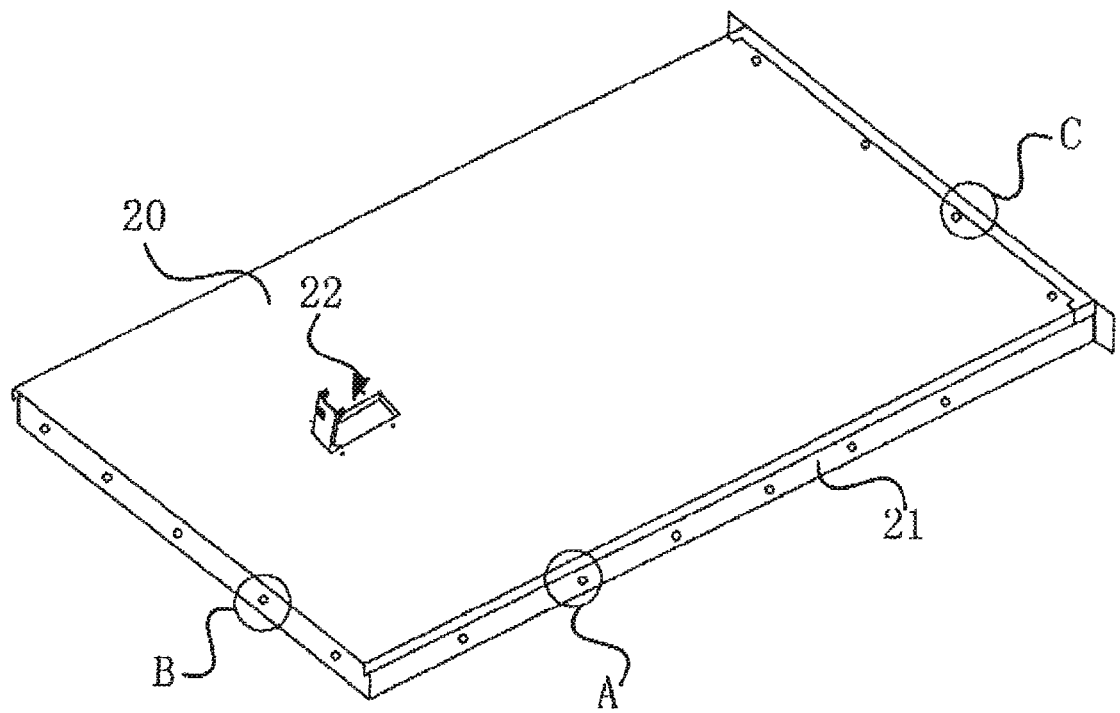
FIG. 9 is a structural schematic view of a top cover of the embodiment.

Referring to FIG. 9, the embodiment further provides a server. The server comprises the case 21, the top cover 20 assembled with the case 21, and the latch device 22 fixed on the top cover 20.

Figure 10:
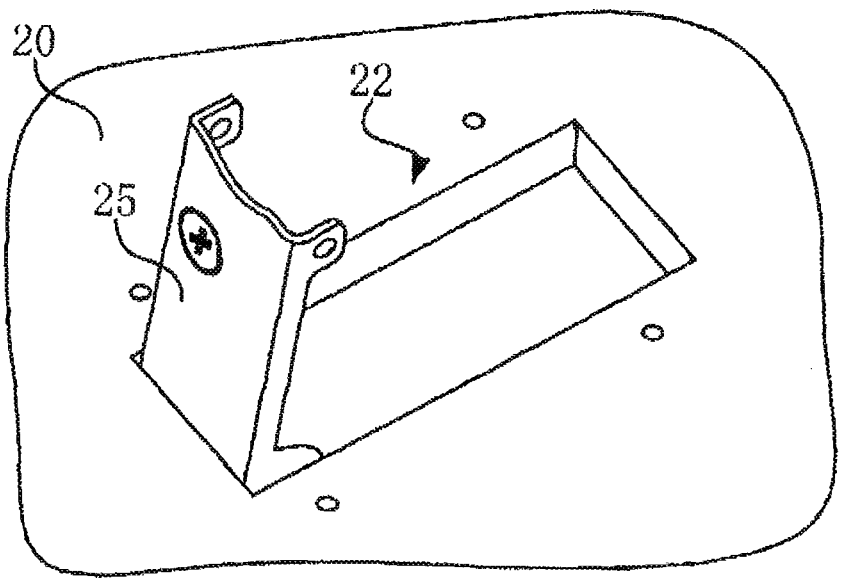
FIG. 10 is a schematic view showing that the latch device of the embodiment is being positioned in an open condition.
Figure 11:
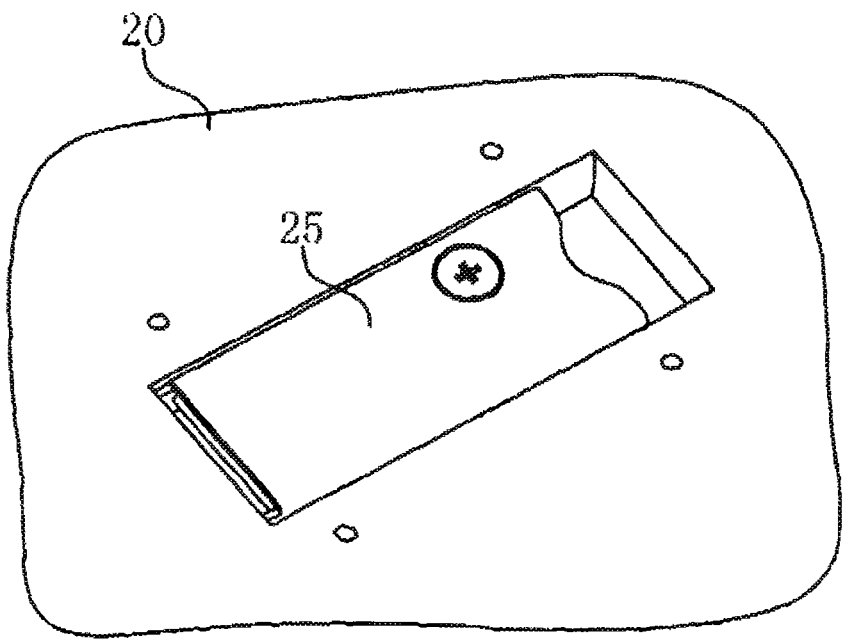
FIG. 11 is a schematic view showing that the latch device of the embodiment is being positioned in a close condition.

The latch device 22 is embedded on the surface of the top cover 20, and the rotating handle 25 is exposed. The containing shelf 24 of the latch device 22 is fixed with the top cover 20. The structure of the latch device 22 is not repeated here. FIGS. 10 and 11 schematically show the open and close condition of the latch device 22 on the top cover 20.

Figure 12:
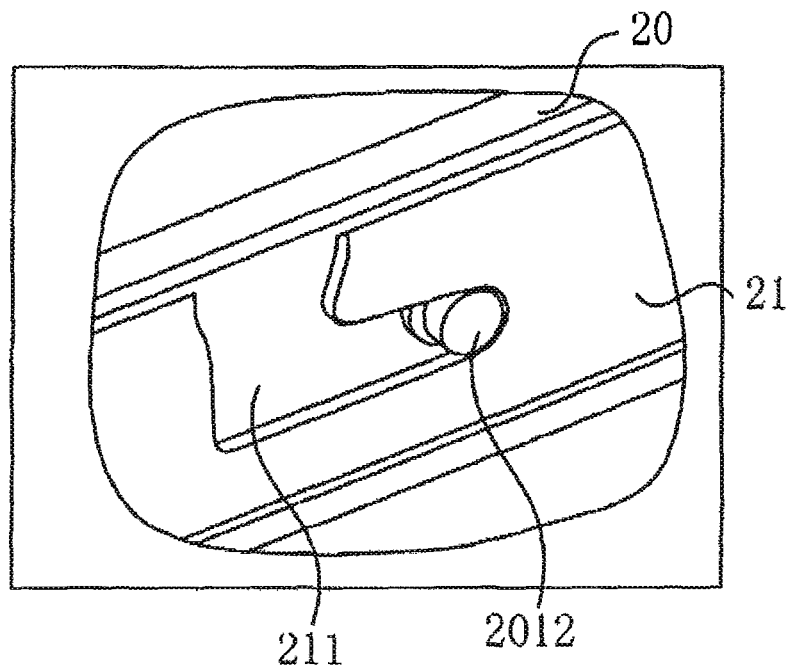
FIG. 12 is a structural schematic view showing that a first position pin matches with an engaging opening.

Please refer to FIGS. 9 and 12, wherein FIG. 12 is an enlarged schematic view of a part A of FIG. 9. The two sides of the case 21 have a plurality of engaging openings 211. The two sides of the top cover 20 have a plurality of first position pins 2012. Since the corresponding position of the case 21 is provided with at least one of the engaging openings 211, the first position pins 2012 engage or disengage the engaging opening 211 when the top cover 20 engages or disengages the case 21. Furthermore, each of the engaging openings 211 permits each of the first position pins 2012 to be moved therein, and prevent each of the first position pins 2012 from departure, so that the inside wall of the top cover 20 is fixed with the corresponding inside wall of the case 21.

Figure 13:
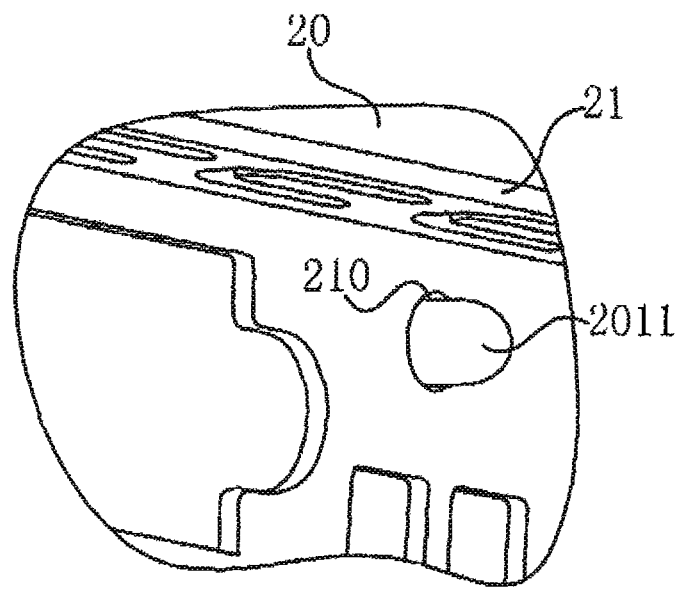
FIG. 13 is a structural schematic view showing that a second position pin matches with a positing hole.

Please refer to FIGS. 9 and 13, wherein FIG. 13 is an enlarged schematic view of a part B of FIG. 9. The rear of the case 21 has a plurality of position holes 210. The rear of the top cover 20 has a plurality of second position pins 2011. When the top cover 20 engages or disengages the case 21, the second position pins 2011 engage or disengage the position holes 210, so that the rear of the top cover 20 is fixed with the corresponding rear of the case 21.

Figure 14:
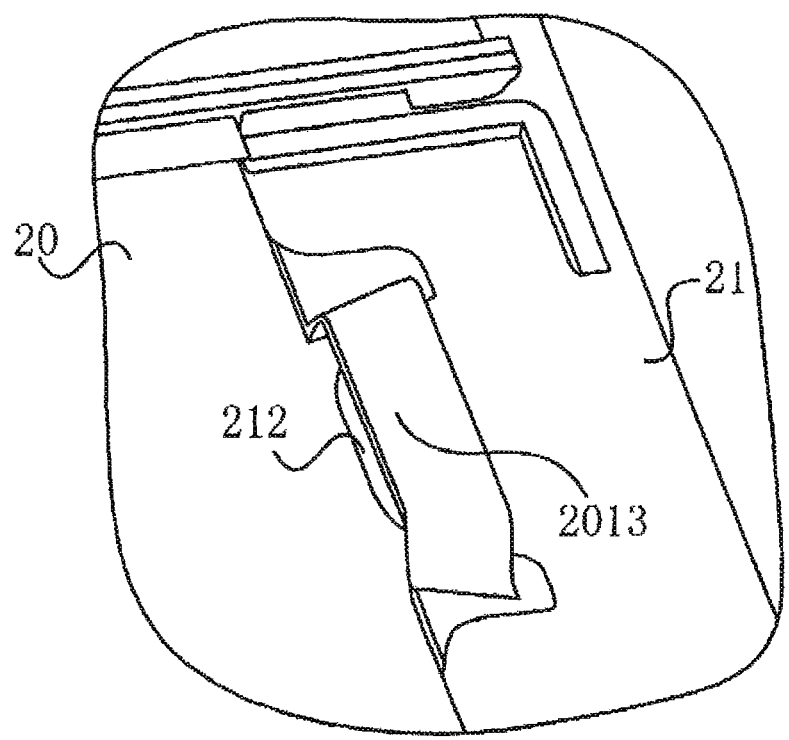
FIG. 14 is a structural schematic view showing that an arched buckle matches with an engaging tongue.

Please refer to FIGS. 9 and 14, wherein FIG. 14 shows an enlarged schematic view of a part C of FIG. 9. The front of the case 21 has a plurality of engaging tongues 212. The front of the top cover 20 has a plurality of arched buckles 2013. When the top cover 20 engages or disengages the case 21, the arched buckles 2013 engage or disengage the engaging tongues 212, so that the front of the top cover 20 is fixed with the corresponding front of the case 21.

When the top cover 20 is assembled with the case 21, the second position pins 2011 are aligned with the position holes 210, and the first position pins 2012 are located at the bottoms of the engaging openings 211, and the arched buckles 2013 are aligned with the engaging tongues 212. When the rotating handle 25 of the latch device 22 is pushed, the latch device 22 drives the top cover 20 moved corresponding to the case 21. At the same time, the second position pins 2011 are inserted into the position holes 210, so as to fix the rear of the top cover 20 with the corresponding rear of the case 21; the first position pins 2012 are moved along the engaging openings 211, so as to fix the inside wall of the top cover 20 with the corresponding inside wall of the case 21; and the arched buckles 2013 are engaged with the engaging tongues 212, so as to fix the front of the top cover 20 with the corresponding front of the case 21.

After the top cover 20 is assembled with the case 21 by using the latch device 22, the top cover 20 is fixed on the case 21 through the second position pins 2011, the first position pins 2012, and the arched buckles 2013. When it is necessary to disassemble the top cover 20 from the case 21, the rotating handle 25 is pulled to move the top cover 20 corresponding to the case 21, and the second position pins 2011, the first position pins 2012 and the arched buckles 2013 are released from the position holes 210, the engaging openings 211, and the engaging tongues 212, so that the top cover 20 is smoothly disassembled from the case 21.

The embodiment has been described with embodiments thereof and it is understood that many changes and modifications to the described embodiment can be carried out without departing from the scope and the spirit of the invention that is intended to be limited only by the appended claims.

The invention claimed is:

1. A latch device used for a server, comprising:
 a positioning post fixed on a case of the server;
 a containing shelf fixed on a top cover of the server;
 a shifting plate fixed in the containing shelf by at least one fixing part, wherein the fixing part permits the shifting plate moving along an opening of the shifting plate, between a first positing and a second position, corresponding to the containing shelf; and
 a rotating handle jointed with the shifting plate by two rotating axles, wherein the rotating handle is able to be moved between a first rotating position and a second rotating position;
 wherein when the positioning post is inserted into an insertion hole of the shifting plate inside the containing shelf the rotating handle is rotated between a first rotating position and a second rotating position to drive backward and forward movements of the containing shelf so that the top cover is driven to be moved backward and forward with the containing shelf, and the shifting plate is moved therewith, between the first rotating position and the second rotating position, corresponding to the containing shelf.

2. The latch device according to claim 1, wherein two corresponding front-rear limiting portions are disposed at two sides of the containing shelf, and two corresponding rotating match portions are disposed at a rotating axle end of the rotating handle and are limited by the front-rear limiting portions, and the containing shelf is driven to be moved backward and forward when the rotating handle is rotated between the first rotating position and the second rotating position.

3. The latch device according to claim 2, wherein each of the front-rear limiting portions has two corresponding active surfaces, and the rotating match portions have two corresponding pushing surfaces corresponding to the active surfaces of the front-rear limiting portions.

4. The latch device according to claim 1, wherein the at least one part includes two fixing parts which permit the shifting plate to be moved along two openings of the shifting plate, between the first position and the second position, corresponding to the containing shelf.

5. The latch device according to claim 1, wherein the rotating handle forms two fixing openings on two sides of an end thereof far away from the rotating axle, two sides of the containing shelf are provided with elastic protrusions, respectively, and when the rotating handle is located in the second rotating position, the elastic protrusions are engaged into the fixing openings.

6. The latch device according to claim 1, wherein a far end of the rotating handle has a lock latch structure on an end thereof far away from the rotating axle, the containing shelf has a lock latch portion, and when the rotating handle is located in the second rotating position, the lock latch structure is rotated to switch the lock latch structure to be open or closed with regard to the lock latch portion.

7. A server with a latch device, comprising:
 a case, a top cover assembled with the case, and a latch device fixed on the top cover;
 wherein the latch device comprises:
 a positioning post fixed on the case of the server;
 a containing shelf fixed on the top cover of the server;
 a shifting plate fixed in the containing shelf by at least one fixing part, wherein the fixing part permits the shifting plate moving along an opening of the shifting plate, between a first positing and a second position, corresponding to the containing shelf; and
 a rotating handle jointed with the shifting plate by two rotating axles, wherein the rotating handle is able to be moved between a first rotating position and a second rotating position;
 wherein when the positioning post is inserted into an insertion hole of the shifting plate inside the containing shelf, the rotating handle is rotated between a first rotating position and a second rotating position to drive backward and forward movements of the containing shelf so that the top cover is driven to be moved backward and forward with the containing shelf while the top cover covers or is released from the case, and the shifting plate is moved therewith, between the first rotating position and the second rotating position, corresponding to the containing shelf.

8. The server with a latch device according to claim 7, wherein two sides of the case have a plurality of engaging openings, the two sides of the top cover have a plurality of first position pins, and the first position pins engage or disengage with the engaging opening when the top cover covers or is released from the case.

9. The server with a latch device according to claim 7, wherein a rear of the case has a plurality of position holes, a rear of the top cover has a plurality of second position pins, and when the top cover covers or is released from the case, the second position pins engage or disengage with the position holes.

10. The server with a latch device according to claim 7, wherein a front of the case has a plurality of engaging tongues, a front of the top cover has a plurality of arched buckles, and when the top cover covers or is released from the case, the arched buckles engage or disengage with the engaging tongues.

\* \* \* \* \*